United States Patent
Yu et al.

(10) Patent No.: US 10,140,400 B2
(45) Date of Patent: Nov. 27, 2018

(54) METHOD AND SYSTEM FOR DEFECT PREDICTION OF INTEGRATED CIRCUITS

(71) Applicant: Dongfang Jingyuan Electron Limited, Beijing (CN)

(72) Inventors: Zongchang Yu, San Jose, CA (US); Jie Lin, San Jose, CA (US); Zhaoli Zhang, San Jose, CA (US)

(73) Assignee: Dongfang Jingyuan Electron Limited, Beijing (CN)

( * ) Notice: Subject to any disclaimer, the term of this patent is extended or adjusted under 35 U.S.C. 154(b) by 118 days.

(21) Appl. No.: 15/419,643

(22) Filed: Jan. 30, 2017

(65) Prior Publication Data

US 2018/0218096 A1    Aug. 2, 2018

(51) Int. Cl.
*G06F 17/50*    (2006.01)

(52) U.S. Cl.
CPC ...... *G06F 17/5009* (2013.01); *G06F 17/5081* (2013.01)

(58) Field of Classification Search
CPC .................................................. G06F 17/5081
USPC ........................................................ 716/51, 52
See application file for complete search history.

(56) References Cited

U.S. PATENT DOCUMENTS

| | | | |
|---|---|---|---|
| 9,189,844 B2 * | 11/2015 | Wu et al. | G06T 7/001 |
| 9,466,463 B1 * | 10/2016 | Lam et al. | H01J 37/28 |
| 9,715,725 B2 * | 7/2017 | Zhang et al. | G06T 7/001 |
| 2002/0035461 A1 | 3/2002 | Chang et al. | |
| 2008/0279444 A1 | 11/2008 | Fischer et al. | |
| 2010/0332206 A1 | 12/2010 | Leu | |
| 2011/0170091 A1 | 7/2011 | Chang et al. | |
| 2015/0324965 A1 | 11/2015 | Kulkarni | |

OTHER PUBLICATIONS

International Search Report dated Feb. 5, 2018 from corresponding PCT Application No. PCT/US2017/059027.

* cited by examiner

*Primary Examiner* — Sun Lin
(74) *Attorney, Agent, or Firm* — Young Basile Hanlon & MacFarlane, P.C.

(57) ABSTRACT

Methods and systems for defect prediction are provided. The method includes receiving feature data of an integrated circuit (IC) and process condition data of a production process associated with the IC, and determining a care area associated with the IC using the feature data, the process condition data, and a defect prediction technique, wherein the care area includes a potential defect and is inspected by a high-resolution inspection system. Based on the provided methods and systems, care areas can be generated incorporating actual process conditions when the inspected IC is being manufactured, and fast and high-resolution IC defect inspection systems can be implemented.

20 Claims, 7 Drawing Sheets

METHOD AND SYSTEM FOR DEFECT PREDICTION OF INTEGRATED CIRCUITS

TECHNICAL FIELD

This disclosure relates to integrated circuits, and more specifically, to methods and systems for defect prediction of integrated circuits.

BACKGROUND

The manufacture of integrated circuits (ICs) is a multi-step process carried out on a substrate such as a wafer. Multiple integrated circuits are typically produced on each wafer and each IC can be referred to as a die. Die inspection is one step of the manufacturing process. Inspection systems can detect defects that occur during the manufacturing process. Optical wafer inspection systems have been conventionally used for wafer and/or die inspection.

SUMMARY

Disclosed herein are aspects, features, elements, and implementations of methods and systems for defect prediction of integrated circuits.

In a first aspect, a method for defect prediction is provided. The method includes receiving feature data of an integrated circuit (IC) and process condition data of a production process associated with the IC, and determining a care area associated with the IC using the feature data, the process condition data, and a defect prediction technique, wherein the care area includes a potential defect and is inspected by a high-resolution inspection system.

In a second aspect, a system for defect prediction is provided including a processor and a memory coupled to the processor. The memory includes instructions executable by the processor to receive feature data of an integrated circuit (IC) and process condition data of a production process associated with the IC, and determine a care area associated with the IC using the feature data, the process condition data, and a defect prediction technique, wherein the care area includes a potential defect and is inspected by a high-resolution inspection system.

In a third aspect, a non-transitory computer readable storage medium for defect prediction is provided including executable instructions that, when executed by a processor, facilitate performance of operations. The operations include receiving, during a production process associated with an integrated circuit (IC), feature data of the IC and process condition data of the production process, and determining, during the production process, a care area associated with the IC using the feature data, the process condition data, and a defect prediction technique, wherein the care area includes a potential defect and is inspected by a high-resolution inspection system.

These and other aspects of this disclosure are disclosed in the following detailed description, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
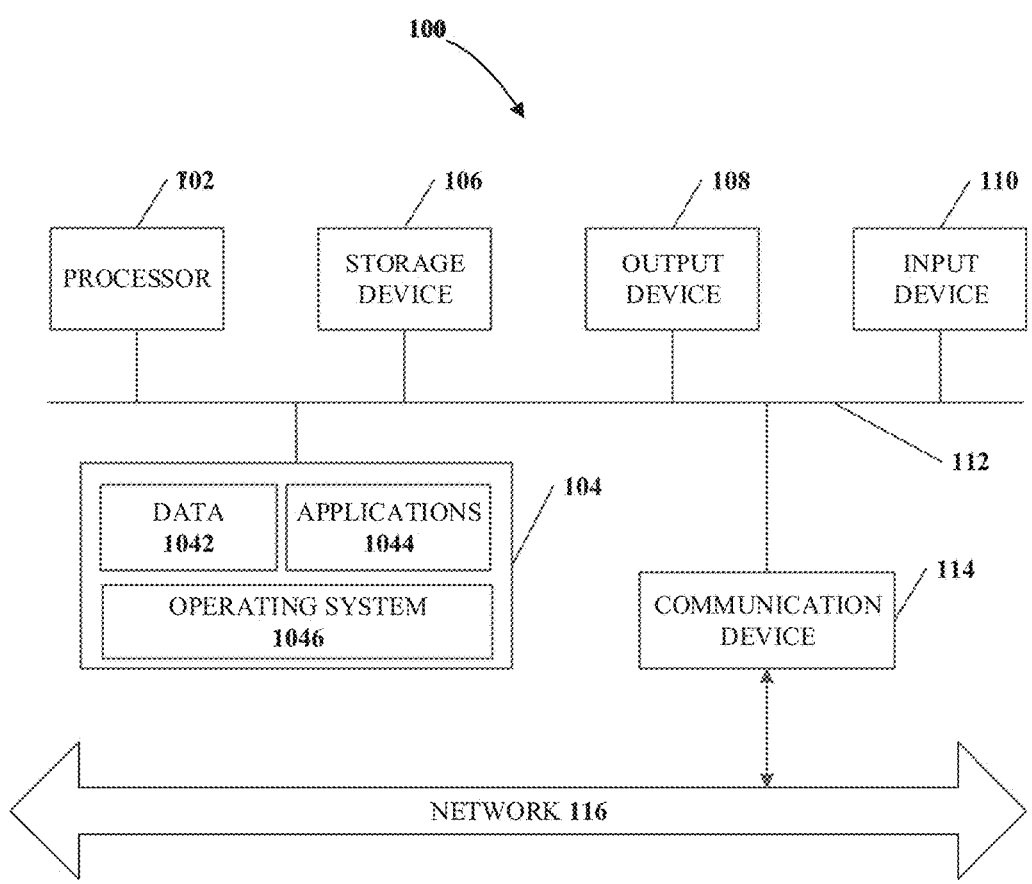
FIG. 1 is a block diagram of an example system used for defect prediction according to implementations of this disclosure.

The manufacture of microchip devices continually strives for smaller sized elements to achieve higher density for integrated circuit (IC) designs on a target wafer. A wafer, also referred to as a substrate, is a thin slice of semiconductor material used for the fabrication of integrated circuits. For example, demand for 10 nanometer (nm) resolution and beyond now exists for features of logic circuits and arrays (e.g., FinFETs, DRAMs, 3D NAND, etc.) in microchip semiconductor fabrication. The process of manufacturing integrated circuits (ICs) involves several phases, including a design phase, a manufacturing phase, and an inspection phase. During the inspection phase, ICs manufactured during the manufacturing phase are inspected for potential defects. The results of the inspection can be used to improve or adjust the design, the manufacturing, and the inspection phases, and any combination thereof.

Detecting defects in such devices and/or defects of small sizes is a challenge in semiconductor manufacturing facilities. Conventional high throughput inspection systems (e.g., optical inspection systems) lack, for example, the resolution to find defects (e.g., physical defects) in manufactured devices. As such, optical inspection systems are not suitable for detecting defects with sizes below their optical resolutions. On the other hand, high-resolution inspection systems, such as electron beam (e-beam or EBeam) systems, can detect such defects. A high-resolution inspection system uses short-wavelength electromagnetic or particle beams to inspect defects. For example, the short-wavelength electromagnetic or particle beams can include, but not limited to, ultraviolet beams, extreme ultraviolet beams, X-ray beams, or electron beams. However, e-beam systems have low throughput. As such, the applicability and suitability of e-beam systems for production line (or inline) defect inspection of integrated circuits has been limited. For example, one week or more may be required to fully scan a single integrated circuit or die using an e-beam system. As such, e-beam systems have conventionally been used during the IC design process or in an off-line inspection and review process and not in inline production systems.

Inspecting an area of a wafer with an e-beam system typically includes beam deflection operations and stage movement operations. A stage movement operation is a mechanical operation which takes a non-negligible amount of time. In this disclosure, "wafer" can refer to a wafer, a reticle, or any specimen to be inspected. Areas of a wafer or a die to be inspected by an e-beam system are typically specified in a recipe file.

One way to increase the throughput of the e-beam system is to generate "care areas" of the wafer (or in other words, providing "defect prediction") and guide the e-beam system to scan the care areas. A care area is an area of a wafer under inspection suspected of containing at least one defect or a "hot spot." As used herein, a "hot spot" can refer to a potential defect. A recipe file can include multiple care areas and, inter alia, coordinates of the care areas. The e-beam system typically moves from one care area to the next in the order specified in recipe file. If the next care area to be inspected is within the e-beam system's field of view (FOV), then a beam deflection operation is performed in order to scan the next scan area. If the next care area is not within the FOV, then a stage movement operation is performed.

There are several conventional methods to generate care areas. One method ("OPC model based simulation method") is based on simulations of an IC or a "chip" (e.g., a die) with a model. The simulation can be performed using an OPC model (the model used for optical proximity correction). An OPC model is calibrated on a specific photolithography process. The OPC model based simulation applies the OPC model on design data of the IC and simulate pattern contours of the IC on the wafer. The design data includes design layout information of the IC, and can be in a form of graphic design standard layout or graphic design system/stream (GDS) file. The OPC model based simulation can be performed under a set of process conditions or process condition parameters. The process conditions incudes a condition of focuses (or, a "focus condition") and a condition of doses (or, a "dose condition"). A focus is a focus position of the optical system measured along the optical axis. A dose (or "exposure dose") is an amount of energy that a surface area of the wafer (e.g., a photoresist area) is subjected to upon exposure by a lithographic exposure system. After the OPC model based simulation, the simulated pattern contours of the IC are compared to the layout information of the IC. Deviations of the simulated patterns from the layout information are generated as a result of the comparison. Suspected or potential defects are determined when the deviation is above a certain threshold, and care areas containing the potential defects are generated for later inspection. The generated care areas are associated with the set of process conditions used in the simulation.

The OPC model based simulation method has some challenges.

A challenge of the OPC model based simulation method is that, OPC models are built and/or calibrated from critical dimension (CD) metrology/measurement data. The CD refers to a size (e.g., a linewidth or a feature width) of a printed feature of patterns, measured at a certain height above the surface of the wafer. A challenge of the OPC model based simulation method is that, to improve accuracy of generation of the care areas, large amount of high-quality metrology data is needed. Collection of the needed high-quality metrology data can be expensive, time-consuming, and labor-intensive. Also, high-quality metrology data can only be obtained under close-to-optimal process conditions. However, defects usually occur under away-from-optimal (or non-optimal) process conditions, which causes the metrology data to be noisy or not reliable. As a result, the OPC model built under the close-to-optimal process conditions needs extrapolation to generate the care areas under the away-from-optimal process conditions. The extrapolation needs an additional qualification process. In addition, CD metrology data and defects can have different signatures. Thus, generation of the care areas using OPC models calibrated from the CD metrology data is an indirect method.

Another challenge of the OPC model based simulation method is that, OPC models are mainly built for simulating lithography processes, which is only an intermediate step in patterning (or "pattern printing") of ICs. The patterning further includes a chemical-mechanical planarization (CMP) process and/or an etch process, and defects after the etch process and/or the CMP process are of high interest. High-quality OPC models considering effects of etch processes and CMP processes are difficult to build.

Another challenge of the OPC model based simulation method is that, actual focus and dose conditions in inline production processes (e.g., in production lines) are not priori, thus they cannot be used as known process conditions in the simulation. To cope with that, the simulation is usually performed under combinations or a grid of different focuses and doses. On one hand, a large-size grid is needed to include or cover the actual focus and dose conditions, resulting a large number of simulations. However, it can happen that many simulations generate no care area due to no potential defect determined under some combinations of focuses and doses, or many combinations of focuses and doses actually do not occur during manufacturing. On the other hand, due to production machine variability, actual values of focuses and doses in inline production processes are not the same as values of focuses and doses used in the simulations. Thus, generation of the care areas using the OPC model based simulation method is inherently inaccurate.

Another challenge of the OPC model based simulation method is that, it takes a significant amount of time to prepare a qualified OPC model, and once the OPC model is qualified, it is fixed or unchangeable. OPC models are usually calibrated and qualified before being applied in the simulations, and metrology data are collected before building the OPC models. However, when new metrology data becomes available, the qualified OPC models cannot improve or evolve itself using the new metrology data. To use the new metrology data for evolving the OPC model for care area generation, a new data set needs to be constructed, and a new cycle of OPC model building needs to be restarted.

Another conventional method ("design-based method") to generate care areas is based on designed layout information of the ICs. During studies of difficulty of patterning, it is found that, under some process conditions in a particular manufacturing process, certain design patterns are more difficult to manufacture than others. The design-based method can develop a "defect prediction model" to generate the care areas based on the patterns with higher patterning difficulty under specific process conditions.

The design-based method also has some challenges.

A challenge of the design-based method is that it fails to properly consider effects resulted from resolution enhancement technique (RET) operations. An RET (e.g., OPC) operation is a step performed on all designed layout information of the ICs before inputting the design data into the production line. Quality of RET operations has a direct consequence on the final patterning quality.

Another challenge of the design-based method is that it fails to properly consider process variability or process condition variations of production machines. The process variability of production machines can directly cause systematic defects during high-volume production. The process variability has a direct effect on the patterning quality. A pattern printed with high quality on a wafer under optimal process conditions can be printed with poor quality due to the process variability (e.g., a small drift of production conditions) of the production machines. During IC manufacturing, many process condition variations can be mapped to condition variations of focus and/or dose. To include different conditions of focuses and doses, different defect prediction models are needed for the design-based method.

The present disclosure provides new methods and systems for care area generation or defect prediction for inspecting ICs using a high-resolution inspection system. Implementations of this disclosure provide technological improvements to semiconductor inspecting machines (e.g., e-beam systems), processes and computer systems, for example, those semiconductor machines and computer systems concerning the inspection of manufactured or fabricated semiconductor ICs. According to implementations of this disclosure, the care areas for an IC can be generated based on output of a full-chip lithography simulation ("full simulation") using design data of the IC. By applying a defect prediction technique or a defect prediction model on the output of the full simulation, potential defects or hot spots in the IC can be obtained. The care areas can then be generated based on the potential defects. Implementations of this disclosure can thus introduce new and efficient improvements in the ways in which integrated circuit are inspected for defects.

While the disclosure has been described in connection with certain embodiments and implementations, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

Additionally, while this disclosure refers to e-beam scanning machine or high-resolution e-beam scanning machine, it is to be understood that the teachings herein can be implemented using any type of scanning machine such as, for example, a high-resolution scanning machine which may have low throughput. For example, the high-resolution scanning machine can be based on high-resolution optical inspection tools. For another example, the high-resolution inspection machine can be based on ultraviolet, extreme ultraviolet, X-ray, charged particles, or neutral particles.

To describe some implementations in greater detail, reference is made to the following figures.

FIG. 1 is a block diagram of a system 100 used for defect prediction in accordance with implementations of this disclosure. The system 100 can include an apparatus such as a computing device, which can be implemented by any configuration of one or more computers, such as a microcomputer, a mainframe computer, a super computer, a general-purpose computer, a special-purpose/dedicated computer, an integrated computer, a database computer, a remote server computer, a personal computer, or a computing service provided by a computing service provider, e.g., a web host, or a cloud service provider. In some implementations, the computing device can be implemented in the form of multiple groups of computers that are at different geographic locations and can or cannot communicate with one another, such as by way of a network. While certain operations can be shared by multiple computers, in some implementations, different computers are assigned different operations. In some implementations, the system 100 can be implemented using general-purpose computers/processors with a computer program that, when executed, carries out any of the respective methods, algorithms and/or instructions described herein. In addition, or alternatively, for example, special purpose computers/processors can be utilized which can contain specialized hardware for carrying out any of the methods, algorithms, or instructions described herein.

The system 100 can have an internal configuration of hardware including a processor 102 and a memory 104. The processor 102 can be any type of device or devices capable of manipulating or processing information. In some implementations, the processor 102 can include a central processor (e.g., a central processing unit or CPU). In some implementations, the processor 102 can include a graphics processor (e.g., a graphics processing unit or GPU). Although the examples herein can be practiced with a single processor as shown, advantages in speed and efficiency can be achieved using more than one processor. For example, the processor 102 can be distributed across multiple machines or devices (each machine or device having one or more of processors) that can be coupled directly or connected across a local area network or other networks. The memory 104 can be any transitory or non-transitory device or devices capable of storing codes and data that can be accessed by the processor (e.g., via a bus). For example, the memory 104 can be accessed by the processor 102 via a bus 112. Although a single bus 112 is shown, multiple buses can be utilized. The memory 104 herein can be a random access memory device (RAM), a read-only memory device (ROM), an optical/magnetic disc, a hard drive, a solid state drive, a flash drive, a security digital (SD) card, a memory stick, a compact flash (CF) card, or any combination of any suitable type of storage device. In some implementations, the memory 104 can be distributed across multiple machines or devices, such as a network-based memory or cloud-based memory. The memory 104 can include data 1042, an operating system 1046 and an application 1044. The data 1042 can be any data for processing (e.g., computerized data files or database records). The application 1044 can include programs that permit the processor 102 to implement instructions to generate control signals for performing functions of the methods in the following description.

In some implementations, besides the processor 102 and the memory 104, the system 100 can also include a secondary, additional or external storage device 106. When present, the storage device 106 can provide additional memory when high processing requirements exist. The secondary storage device 106 can be a storage device in the form of any suitable non-transitory computer readable medium, such as a memory card, a hard disc drive, a solid state drive, a flash drive or an optical drive. Further, the storage device 106 can be a component of the system 100 or can be a shared device that is accessed via a network. In some implementations, the application 1044 can be stored in whole or in part in the storage device 106 and loaded into the memory 104 as needed for processing. For example, the storage device 106 can be a database.

In some implementations, besides the processor 102 and the memory 104, the system 100 can include an output device 108. The output device 108 can be implemented in various ways, for example, it can be a display that can be coupled to the system 100 and configured to display a rendering of graphic data. The output device 108 can be any device transmitting a visual, acoustic, or tactile signal to a user, such as a display, a touch sensitive device (e.g., a touch screen), a speaker, an earphone, a light-emitting diode (LED) indicator, or a vibration motor. If the output device 108 is a display, for example, it can be a liquid crystal display (LCD), a cathode-ray tube (CRT), or any other output device capable of providing visible output to an individual. In some cases, an output device can also function as an input device—a touch screen display configured to receive touch-based input, for example.

The output device 108 can alternatively or additionally be formed of a communication device for transmitting signals and/or data. For example, the output device 108 can include a wired mean for transmitting signals or data from the system 100 to another device. For another example, the output device 108 can include a wireless transmitter using a protocol compatible with a wireless receiver to transmit signals from the system 100 to another device.

In some implementations, besides the processor 102 and the memory 104, the system 100 can include an input device 110. The input device 110 can be implemented in various ways, such as a keyboard, a numerical keypad, a mouse, a trackball, a microphone, a touch sensitive device (e.g., a touch screen), a sensor, or a gesture-sensitive input device. Any type of input device not requiring user intervention is also possible. For example, the input device 110 can be a communication device such as a wireless receiver operating according to any wireless protocol for receiving signals. The input device 110 can output signals or data, indicative of the inputs, to the system 100, e.g., via the bus 112.

In some implementations, besides the processor 102 and the memory 104, the system 100 can optionally include a communication device 114 to communicate with another device. Optionally, the communication can be via a network 116. The network 116 can be one or more communications networks of any suitable type in any combination, including, but not limited to, networks using Bluetooth communications, infrared communications, near field connections (NFC), wireless networks, wired networks, local area networks (LAN), wide area networks (WAN), virtual private network (VPN), cellular data networks and the Internet. The communication device 114 can be implemented in various ways, such as a transponder/transceiver device, a modem, a router, a gateway, a circuit, a chip, a wired network adapter, a wireless network adapter, a Bluetooth adapter, an infrared adapter, an NFC adapter, a cellular network chip, or any suitable type of device in any combination that is coupled to the system 100 using the bus 112 to provide functions of communication with the network 116.

The system 100 can communicate with a wafer or reticle high-resolution inspection equipment. For example, the system 100 can be coupled to one or more wafer or reticle inspection equipment, such as an e-beam system or an optical system, configured to generate wafer or reticle inspection results.

The system 100 (and algorithms, methods, instructions etc. stored thereon and/or executed thereby) can be realized in hardware including, for example, intellectual property (IP) cores, application-specific integrated circuits (ASICs), programmable logic arrays, optical processors, programmable logic controllers, microcode, firmware, microcontrollers, servers, microprocessors, digital signal processors or any other suitable circuit. In this disclosure, the term "processor" should be understood as encompassing any the foregoing, either singly or in combination. The terms "signal," "data," and "information" are used interchangeably. Further, portions of system 100 do not necessarily have to be implemented in the same manner.

Figure 2:
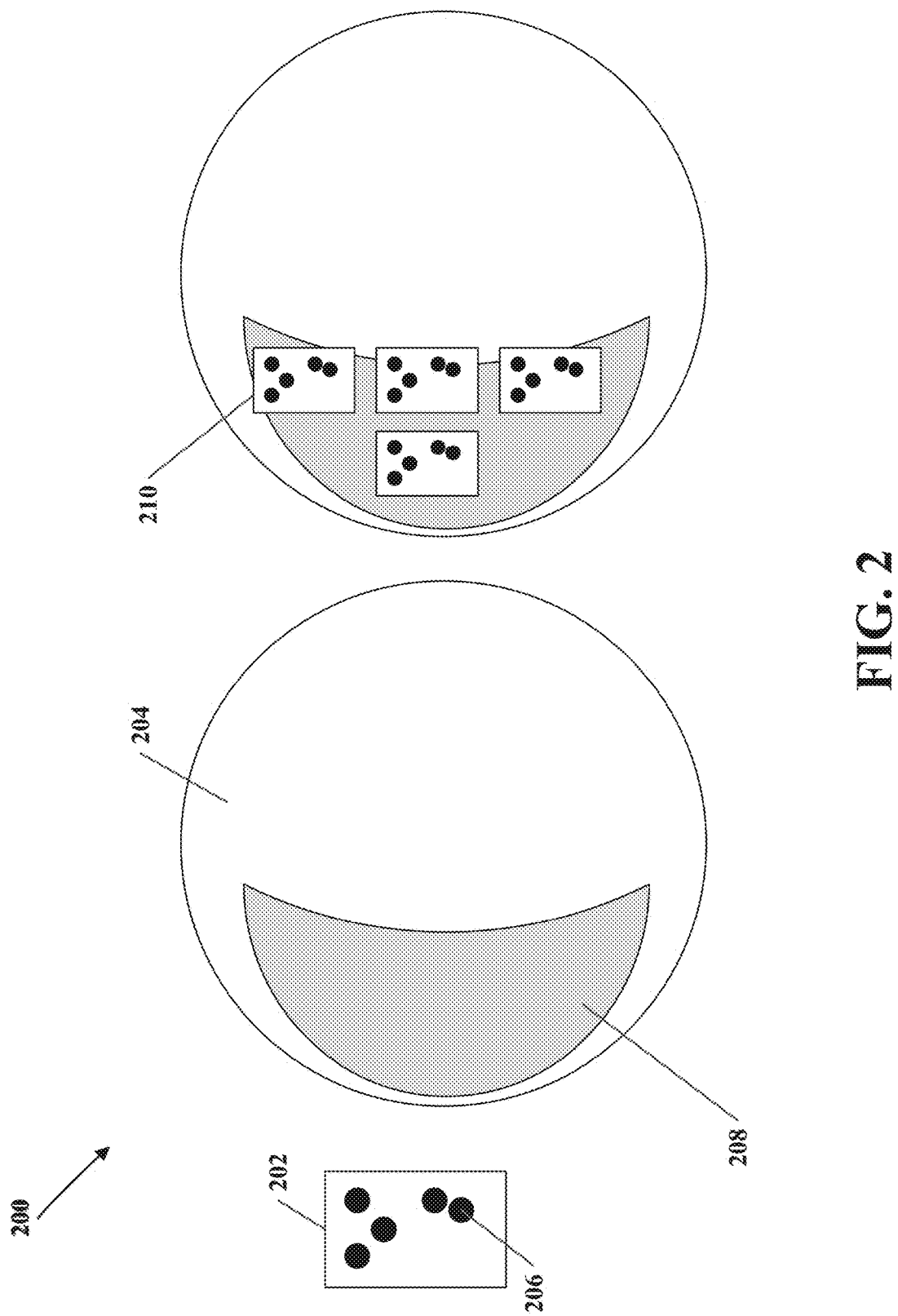
FIG. 2 is an example of an operation for defect prediction according to implementations of this disclosure.

FIG. 2 is an example of an operation 200 for hot spot prediction according to implementations of this disclosure. The operation 200 illustrates a manufacturing process and/or design process of an integrated circuit 202 (e.g., a die). The integrated circuit 202 is analyzed during the operation 200 to determine hot spots 206 (i.e., black circles on the integrated circuit 202 of FIG. 2). A hot spot relates to a design pattern which, when manufactured under undesirable or unexpected manufacturing process conditions (i.e., process condition variations or process variability), can render a die inoperable or result in an actual defect within the die that affects the overall performance of the die. Undesirable or unexpected manufacturing process conditions are manufacturing conditions that deviate from the ideal process conditions. ICs manufactured under ideal process conditions exhibit minimal or no defects.

In the operation 200, a wafer 204 under inspection by an inspection process is scanned by a high-resolution system including but not limited to an electron beam (e-beam) system to obtain or provide a process condition variation map. The process condition variation map is obtained by scanning the wafer 204 for certain pre-designed or pre-selected patterns and analyzing the high-resolution images via, for example, a set of computer instructions. The pre-designed or pre-selected patterns are IC design patterns which are suspected to be sensitive to process condition variations. For example, the shapes of the pre-designed or pre-selected patterns on wafer can change substantially when the manufacturing process experiences variations from ideal conditions. The pre-designed or pre-selected patterns can be selected based on prior knowledge (from information of an operator, information stored in a database, or information extracted using machine learning techniques) that the areas are sensitive to process condition variations. The pre-designed or pre-selected patterns can also be selected based on the chip designs of the integrated circuits being manufactured and inspected. Metrology or measurement results from these pre-designed or pre-selected patterns, obtained with an e-beam system, are then converted to process condition parameters. The process condition parameters can be used to generate one or more process condition variation maps. A process condition variation map indicates how different parts of a wafer may be affected by variations in the process conditions (e.g., variation in focus or dose). Variations in process conditions can result in defects in the manufactured dies.

In the operation 200, a process condition variation map reveals that an area 208 of the wafer 204 exhibits significant process condition variations. In another implementation, the area 208 represents the process condition variation map (and not just a subset of the process condition variation map) that has been determined via the operation 200. As such, the inspection process of the operation 200 only inspects certain dies (such as a die 210) of the wafer 204 for defects which is more efficient and less time-consuming than an inspection process that inspects the entire area of the wafer 204. The dies to be inspected for defects are those dies which are included in, or overlap with, the area 208. In another implementation, the dies that are inspected include dies that are within a predetermined area or distance of the area 208 even if they don't overlap with or are not enclosed within the area 208.

The hot spots of such dies may be determined upon further inspection to be true actual defects. Whether any of the hot spots of the die 210 is a true defect is determined by an inspection (e.g., additional scanning by the e-beam system). The hot spots of dies that are outside of, or not overlapping, the area 208 are not expected to result in actual defects and, therefore, do not have to be inspected. As described below, inspecting a hot spot means inspecting a care area that contains the hot spot. In an implementation, only care areas overlapping the area 208 are inspected. That is, instead of inspecting all the care areas of a die that is included in, or overlaps, the area 208, only the care areas inside the area 208 of those dies are inspected. While the area 208 is illustratively shown as a continuous area, this need not be the case. The shape of area 208 is not so limited and for example, can comprise various shapes separated by gaps or spaces.

In an implementation, the hot spots are assigned severity levels based upon various factors including but not limited to design features and the purpose or usage of the integrated circuits. The hot spots that are determined to have a high severity level and are thus deemed to be more important than hot spots with lower severity levels (e.g., hot spots that have high severity levels because they are near critical areas of the integrated circuit) are also scanned even if they do not fall within or overlap with the area 208. In other words, if dies that fall outside of the process condition variation map include hot spots that have been determined to have a high severity (e.g., a severity level that is greater than a threshold severity value) or importance level, they can also be scanned for actual defects. In an implementation, potential defects with low severity values are also called warm spots. Warm spots are less likely to become an actual defect. When resources are less available or constrained, areas containing warm spots can be skipped for inspection. A resource can be the amount of time available to the e-beam system to scan during the inspection process. Whether and which warm spots are included in the list for inspection is determined by resource availability and its severity.

As illustrated by the operation 200, an inspection method and system in accordance with the present disclosure significantly reduce wafer regions and dies to be inspected by a high-resolution inspection or e-beam system. Consequently, the time and cost required to inspect a manufactured wafer and the associated integrated circuits or dies is reduced and a low throughput, high-resolution, e-beam scanning machine or device can be used for in-line inspection of the semiconductor manufacturing process.

Figure 3:
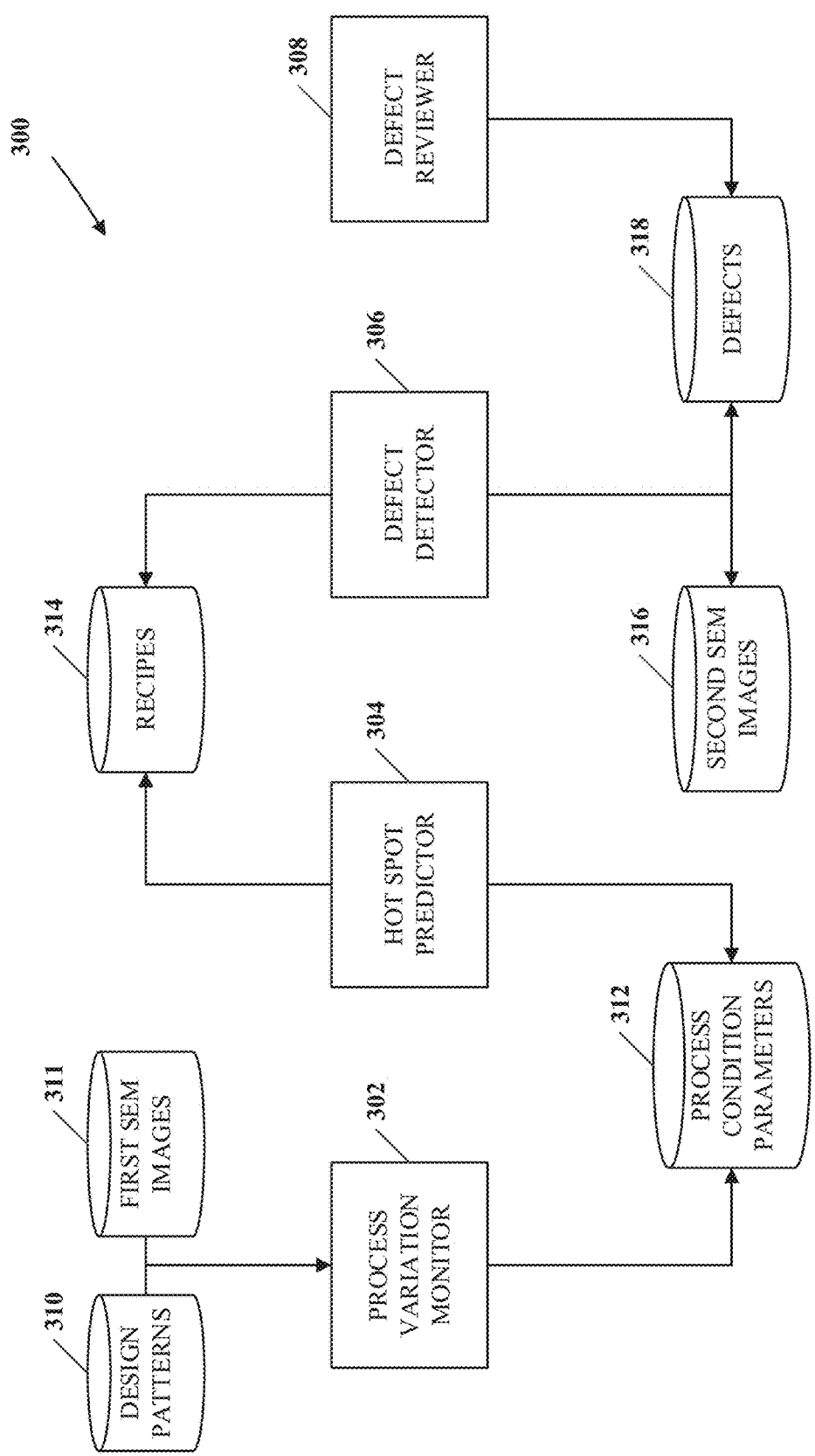
FIG. 3 is an example of a system for defect inspection according to implementations of this disclosure.

FIG. 3 is an example of a system 300 for detecting defects according to implementations of this disclosure. Aspects of the disclosure, e.g., operations of methods/processes 400-900 of FIGS. 4-9, respectively, can be implemented as software and/or hardware modules in the system 300. For example, one or more apparatuses or systems, such as the system 100 of FIG. 1, can implement one or more modules of the system 300. The system 300 can include or can be operated in conjunction with a high-resolution (e.g., e-beam) scanning and inspection machine.

In an implementation, the system 300 includes a process variation monitor module 302, a hot spot predictor module 304, a defect detector module 306, a defect reviewer module 308, design patterns 310, first scanning electron microscope (SEM) images 311, process condition parameters 312, recipes 314, second SEM images 316, and defects 318.

The design patterns 310 can be stored in a data store, such as a database, of design patterns that are known, or suspected to be, sensitive to variations in the manufacturing or fabrication process (i.e., process variations). For example, process variations can include focus variations and dose variations of the manufacturing process. Process variations can result, for example, in thickness variations, pattern defects, wrongly sized patterns, and like defects in a manufactured IC. The process variation monitor module 302 searches for matches or similarities between the design patterns 310 received or reviewed and one or more integrated circuit design layouts associated with the integrated circuits being manufactured and inspected including, but not limited to, files or layouts generated by or using an electronic design automation (EDA) software. The search can result in a list of identified design patterns. Additionally, or alternatively, the process variation monitor module 302 can receive additional patterns. The term "receive" used herein can refer to receiving, inputting, acquiring, retrieving, obtaining, reading, accessing, or any action in any manner for inputting information or data.

The process variation monitor module 302 causes a high-resolution inspection system (e.g., an e-beam system) to scan patterns on a wafer to identify wafer process condition variation maps. In this context, "cause" can mean sending commands directly to, sending commands via an intermediary mechanism or system, or any other way that causes the high-resolution inspection machine to scan a wafer. The patterns are selected from pre-designed or pre-selected patterns based on, one or more or a combination of, the design rules of a layer of the wafer under manufacturing and the ideal process conditions. The patterns, which are sensitive to process condition variations, can be generated by performing simulations. For example, and without limitation, a simulation of a defocus by 10 nm can be performed and the resulting patterns can be compared to design files. Alternatively, or additionally, the resulting patterns are compared to the results of a simulation of ideal process conditions (e.g., where no defocus is performed).

The process variation monitor module 302 obtains a first set of high-resolution SEM images (e.g., the first SEM images 311) from an inspection equipment, such as, for example, the e-beam system (not shown). Throughout, "obtain" means any way by which a method, a module, or a device can use the indicated information to carry out the functionality of the module or the steps of the method or device. Non limiting examples of "obtain" include requesting information from another source, receiving the information from another source, requesting that another source generate or acquire the information, retrieve from a data store, etc. The process variation monitor module 302 then analyzes the first SEM images 311 and calculates or computes the process condition parameters under which the patterns were manufactured. Analyzing the images includes comparing the images to reference images including, but not limited to, images generated from GDS files associated with the design of the integrated circuits or dies being manufactured and inspected. The process variation monitor module 302 stores the process condition parameters as process condition parameters 312. The process condition parameters 312 can be stored in a transient store, such as the memory 104 of FIG. 1, or a permanent store, such as the storage device 106 of FIG. 1. For example, the permanent store can be a database that stores the design patterns 310 or another database.

The hot spot predictor module 304 generates care or concern areas based on the process condition parameters 312 that are received or obtained from the store that stores them. A care area is an area on a fabricated wafer, such as an area of a die, which can receive inspection for the detection of defects. A care area may be inspected because it is suspected of containing a defect in the die being manufactured. The hot spot predictor module 304 can predict hot spots (i.e., potential defects) based on the process condition parameters 312 and feature data generated based on the design patterns 310. The feature data can be indicative of features of the design patterns 310. For example, the feature data can be generated based on lithography simulation (e.g., a full simulation) using the design patterns 310. The hot spot predictor module 304 obtains the process condition parameters 312 identified by the process variation monitor module 302 to determine the potential defects or hot spots.

The hot spot predictor module 304 uses the process condition parameters 312 to predict or determine hot spots and to generate a list of care areas therefrom. The hot spot predictor module 304 can generate one or more recipes 314 (or recipe files) based on the list of care areas. The recipes 314 can be stored in a similar database that stores the design patterns 310 and the process condition parameters 312 or a different database. As used herein, a recipe can be a set of one or more machine parameters, scan conditions, care area coordinates, detection mode and other parameters to be used by the high-resolution (e.g., e-beam) inspection system for defect detection.

The e-beam system may be configured based on the recipes 314. The e-beam system can scan a wafer according to a recipe of the recipes 314 or multiple recipes of the recipes 314. The hot spot predictor module 304 can be configured to save a recipe to one or more files. The inspection machine obtains the recipes 314 and performs one or more scans based on the recipes 314. In an implementation, the hot spot predictor module 304 can cause an inspection machine to perform the inspection or the scanning based on the recipes 314. Alternatively, the defect detector module 306 can cause the inspection machine to perform scanning based on the recipes 314. Other ways, as may be configured by a fabrication workflow, can be used to cause an inspection machine to perform the scanning based on the recipes 314. The result of the scanning, based on the recipes 314, is a second set of high-resolution images, such as the second SEM images 316.

In an implementation, the hot spot predictor module 304 can base the predicted hot spots on resource availability. A resource can be the amount of time available to the e-beam system to scan during the inspection process. A resource can also be the complexity of the patterns to be scanned which in turn affects the scan time. When more resources are available, warm spots can also be included in the list of hot spots to be scanned. A warm spot can be a potential defect that is less severe than a hot spot. A warm spot can be a potential defect that is less likely to be a defect than a hot spot. A warm spot can be located within a non-critical region of a die where the non-critical region is manufactured under process conditions that moderately deviate from the ideal manufacturing conditions. A warm spot can be located within a critical region of a die where the critical region is manufactured very close to the ideal manufacturing conditions. When resources are unavailable or are constrained, care areas corresponding to the warm spots can be skipped for inspection as the chances or probabilities that these warm spots adversely affect the functionality of manufactured IC chip are less in comparison to the hot spots. Whether and which warm spots are included in the list of hot spots can be a function of resource availability and based on a likelihood that a warm spot becomes a hot spot.

The defect detector module 306 determines whether the hot spots (i.e., potential defects) are actual defects. To make the determination, the defect detector module 306 can use the second SEM images 316. The defect detector module 306 can, for example, compare SEM images to reference images to identify differences, and/or chip design information associated with the design of the integrated circuit being manufactured and inspected to identify discrepancies between the chip design and a fabricated integrated circuit chip or die as captured in the second SEM images 316. The chip design information can be one or more, or a combination, of reference images of the design, GDS files, or other information indicative of the design. The defect detector module 306 can generate information regarding the hot spots, the actual defects, or both. For example, the defect detector module 306 can store, such as the defects 318, information regarding which hot spots are actual defects, which hot spots are not actual defects, which defects are nuisances (i.e., not detrimental to the overall or proper functioning of a die), which defects are fatal (e.g., including but not limited to defects that affect the functioning of a die), or any combination thereof.

The defect reviewer module 308 can use the defects 318 to improve the overall hot spot prediction and inspection of the integrated circuits. The defect reviewer module 308 can be separate from, be the same as, or can work in conjunction with the hot spot predictor module 304 or other modules of the system 300 of FIG. 3. The defect reviewer module 308 continuously improves the performance of the hot spot prediction accuracy of the hot spot predictor module 304 during the course of inspection. The defect reviewer module 308 includes an update mechanism that enables the system 300 to continuously improve performance of the prediction of the potential defects or hot spots (or even warm spots). The defect reviewer module 308 can utilize machine learning techniques to update the prediction and can also use data from a plurality of manufacturing inspections (either at the same plant or other plants around the world using a similar system). For example, if certain predicted hot spots have been previously found to not include true or actual defects, then the hot spot predictor module 304 can cease generating care areas for these certain predicted hot spots thereby shortening the time associated with the inspection process. In other words, potential defects or hot spots or the care areas generated using the hot spots that never uncover actual defects can be omitted from the inspection process to save time and costs.

Figure 4:
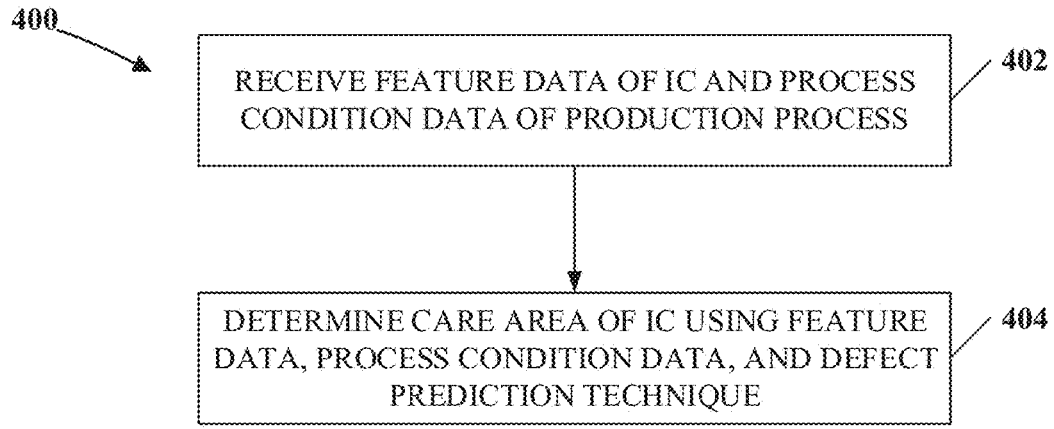
FIG. 4 is a flowchart of an example process of a method for defect prediction according to implementations of this disclosure.

FIG. 4 is a flowchart of an example process 400 of a method for defect prediction according to implementations of this disclosure. The process 400 can be implemented as software and/or hardware modules in the system 100 of FIG. 1 and/or the system 300 of FIG. 3. For example, the process 400 can be implemented as modules included in the system 300 by one or more apparatuses or systems included in the system 100. The process 400 includes operations 402-404, which are set forth as follows. At operation 402, feature data of an integrated circuit (IC) and process condition data (e.g., process condition parameters) of a production process (i.e., the manufacturing process of the integrated circuits) associated with the IC is received. In some implementations, the operation 402 can be performed when the IC is being inspected.

The feature data is data indicative of features (e.g., geometry or topographical features) of patterns of the IC printed on a wafer. The feature data can be generated using apparatuses or modules of the system 300, such as the system 100 in FIG. 1. For example, the feature data can be data included in design data of the IC. The design data can include a design layout of the IC. In some implementations, the design data can be one or more GDS files, and the feature data can include a polygon (e.g., generated from a GDS file of the design data). In some implementations, the GDS files can include design GDS files or post-OPC GDS files. For another example, the feature data can be data generated using the design data. In some implementations, the feature data can include a rendered image (e.g., an image rendered from the polygon) or a processed image (e.g., an image generated from the rendered image using an image processing technique). In some implementations, the feature data can be any combination of any data as mentioned above.

The process condition data is data indicative of a process condition (process condition parameter) or a process variation of the production process, and/or environmental conditions associated with the production process. The production process can be an inline production process, such as, for example, a condition/parameter of apparatuses/environment of a production line of the IC when the IC is being manufactured. The process condition data can be on a wafer level, which means the process condition data indicates the process/environmental conditions are used by ICs on the same wafer. In some implementations, the process condition data can include a focus condition of the production process, a dose condition of the production process, or a combination thereof. In some implementations, the process condition data can include machine variability data that indicative of process condition shifts of a machine. The process condition data can be obtained through a process condition monitor of the production process, such as, the process variation monitor module 302 in the system 300 of FIG. 3. For example, the process variation monitor module 302 can obtain the process condition data when the IC is being manufactured (in real-time), and store the obtained process condition data into a database. The stored process condition data can be retrieved when the IC is being inspected.

At operation 404, a care area associated with the IC is generated using the feature data, the process condition data, and a defect prediction technique. As mentioned in previous description, the care area includes a potential defect (a "hot spot") and is used for later inspection. In some implementations, the care area can simply indicate that a defect is potentially existing in the care area. In some other implementations, the care area can indicate further information (e.g., a location and/or a defect type) of the potential defect. The later inspection can be performed by a high-resolution inspection system. In some implementations, the high-resolution inspection system can include an electron beam inspection system. However, any inspection system that generates high-resolution images as inspection results (e.g., inspection systems using short-wavelength electromagnetic or particle beams) can be used as the high-resolution inspection system in the operation 404.

The defect prediction technique can be implemented as software and/or hardware modules of the system 300, such as, for example, the hot spot predictor module 304 in FIG. 3. In some implementations, the defect prediction technique can use a "defect prediction model" (e.g., implemented as a software or hardware module) that includes sets of algorithms and parameters which can take the feature data and the process condition data as input and generate potential defects as output.

In some implementations, the parameters of the defect prediction model can include a parameter associated with focus conditions, a parameter associated with dose conditions, a parameter associated with etching, a parameter associated with chemical-mechanical planarization (CMP), or any combination thereof.

By including the above-mentioned parameters, the defect prediction model is capable of generating care areas in consideration of wide ranges of process condition data including the received ones (e.g., the focus condition and the dose condition) and other condition data beyond the lithography process (e.g., condition data of an etching process or a CMP process). When a different IC is being inspected, in which case its associated process condition data is also different, the same defect prediction model can be used for care area generation as long as values of the parameters associated with the different IC are still within permitted ranges. The values of the parameters of the defect prediction model can be determined based on the received process condition data, other data received from modules of the system 300, and/or user inputs.

The defect prediction model can use various techniques to predict potential defects. The techniques can be based on statistics or machine learning. For example, the various techniques can include a logistic regression technique, a support vector machine (SVM) technique, a neural network (NN) technique, a restricted Boltzmann machine (RBM) technique, or any combination thereof. In some implementations, a user can also supplement the defect prediction model with data (e.g., certain rules) from prior experience. The prediction can be based on deterministic correlation between input feature data and defect probability under various process condition parameters, or statistical correlation between the feature data and the defect probability under the various process condition parameters.

Figure 5:
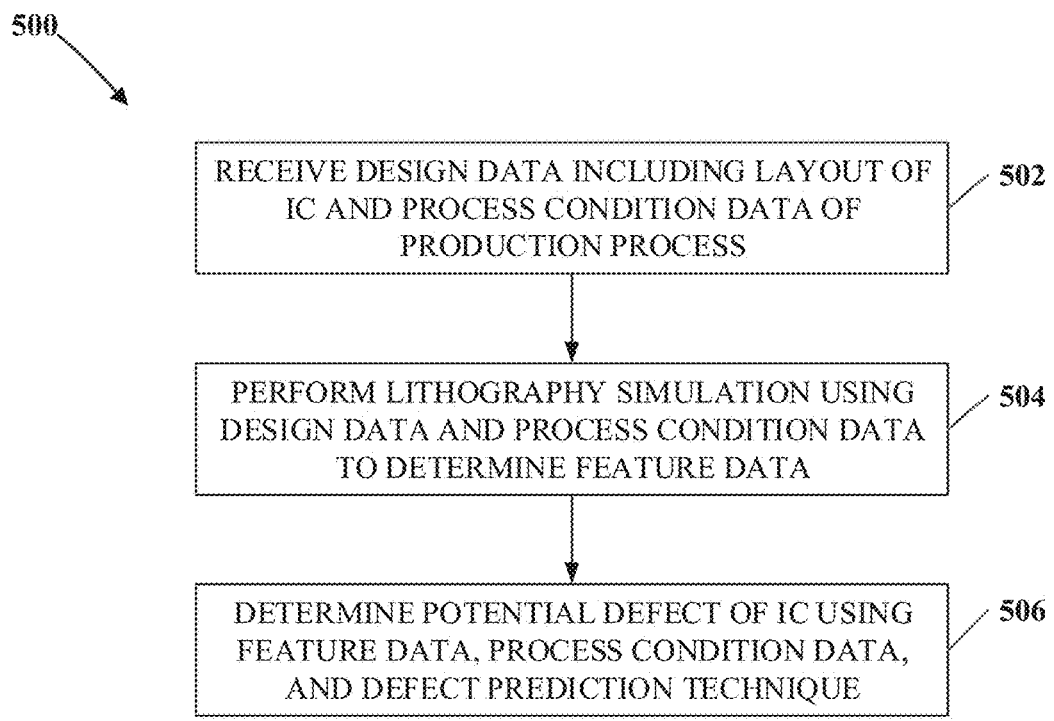
FIG. 5 is a flowchart of another example process of a method for defect prediction according to implementations of this disclosure.

In some implementations, the feature data in the process 400 of FIG. 4 can be generated using the design data. The feature data can also be generated in an offline process. FIG. 5 is a flowchart of an example process 500 of a method for defect prediction according to implementations of this disclosure. The process 500 can be implemented as software and/or hardware modules in the system 100 of FIG. 1 and/or the system 300 of FIG. 3. For example, the process 500 can be implemented as modules included in the system 300 by one or more apparatuses or systems included in the system 100. The process 500 includes operations 502-506, which are set forth as follows.

At operation 502, design data of the IC and process condition data of a production process are received. The design data can include a layout of the IC. In some implementations, the design data can be in a form of GDS files. The receiving of the process condition data is similar to the operation 402 in the process 400 of FIG. 4.

At operation 504, lithography simulation is performed using the received design data and process condition data to determine the feature data. The operation 504 can be performed offline, such as, for example, when the production process and/or the inspection process is not on-going.

In some implementations, the lithography simulation is a full-chip lithography simulation (a "full simulation") of the IC based on the design data of the IC (e.g., the GDS files). The full simulation is on a chip level, which means the scope of the full simulation is for a chip (e.g., a die) on a wafer. In some implementations, the full simulation can be performed under certain combinations of process condition data (e.g., a certain focus condition and a certain dose condition). The full simulation results can be used to generate the feature data (e.g., simulated latent images on wafer or simulated pattern contours on wafer). The full simulation can be computing intensive. For example, the full simulation can be performed on a computer farm.

At operation 506, a potential defect associated with the IC is predicted using the feature data, the process condition data, and a defect prediction technique. This operation is similar to the operation 404 in the process 400 of FIG. 4.

As shown from the process 400 and the process 500, by using the defect prediction technique (e.g., including a defect prediction model), the feature data generated from the full simulation results of the IC with the process condition data obtained when the IC is being manufactured (i.e., during the manufacturing process) can be considered in predicting potential defects. The same defect prediction model can be "evolved" or fine-tuned through an improving process to improve performance (e.g., accuracy and/or efficiency) of the potential defect prediction. The improving process can be automatic (i.e., without any user's manual intervention). In some implementations, the improving process can be manually controlled. When the defect prediction technique is fine-tuned using the improving process and stabilized in high performance, a high-speed and high-resolution inline defect inspection system for ICs can be implemented based on the stabilized high performance of the defect prediction technique.

Figure 6:
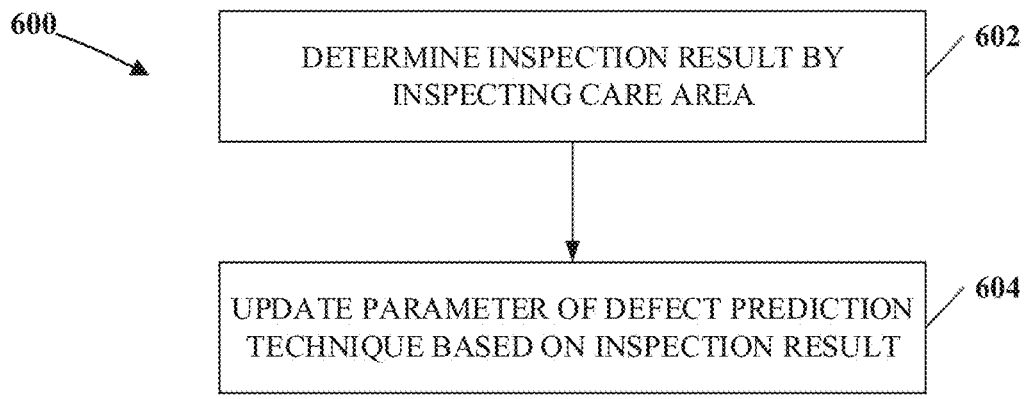
FIG. 6 is a flowchart of an example process of a method for improving defect prediction according to implementations of this disclosure.

FIG. 6 is a flowchart of an example process 600 of a method for improving defect prediction according to implementations of this disclosure. The process 600 can be implemented as software and/or hardware modules in the system 100 of FIG. 1 and/or the system 300 of FIG. 3. For example, the process 600 can be implemented as modules included in the system 300 by one or more apparatuses or systems included in the system 100. The process 600 includes operations 602-604, which are set forth as follows.

At operation 602, an inspection result is determined by inspecting a care area using a high-resolution inspection system. The care area can be generated as a result of the process 400 or 500 (e.g., after the operation 404 or 506). For example, the inspection of the care area in the operation 602 can be performed by the defect detector module 306 in FIG. 3. In some implementations, the high-resolution system can be an electron beam inspection system. Output data of the inspection can be high-resolution images (e.g., SEM images) of the inspected IC.

After inspecting the care area, the output data of the inspection can be reviewed and analyzed to generate or determine the inspection result. In some implementations, the reviewing and analyzing of the output data of the inspection can be performed by the defect reviewer module 308 in the system 300 of FIG. 3. For example, the reviewing and analyzing can be implemented as comparing the potential defect in the care area and actual defects found by the inspection. The inspection result can indicate an actual defect situation detected in the inspected area. For example, the inspection result can indicate that, in the inspected care area, an actual defect is detected, no actual defect is detected, an actual defect is detected to be a nuisance, an actual and non-nuisance defect is detected but does not match the potential defect (e.g., in a different location or is of a different defect type) in the generated care area, or any combination of the aforementioned situations. The inspection result is not limited to the examples listed herein, and can indicate any defect situation as a result of the inspection.

At operation 604, a parameter of the defect prediction technique is updated based on the inspection result. For example, the update of the parameter can be ruled based. For example, if no actual defect is detected in the care area, a first parameter of the defect prediction model is updated; if an actual defect is detected in the care area and is a nuisance, a second parameter of the defect prediction model is updated; or if an actual and non-nuisance defect is detected in the care area but does not match to the potential defect (e.g., in a different location or is of a different defect type) in the care area, a third parameter of the defect prediction model is updated. In the previous example, the first, second, and third parameter can be the same or different parameters. Other examples of updating the parameters of the defect prediction technique based on the inspection result are possible and are not limited to the previous example.

Figure 7:
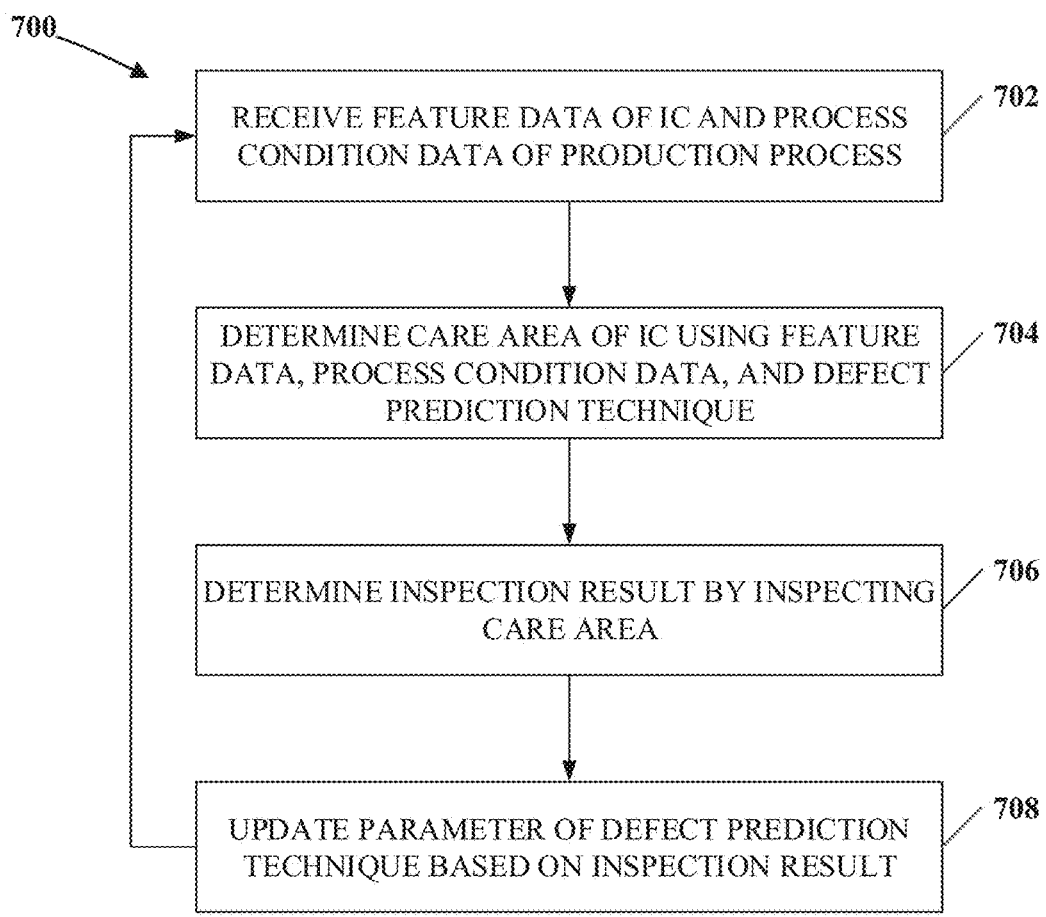
FIG. 7 is a flowchart of another example process of a method for improving defect prediction according to implementations of this disclosure.

The improving process (e.g., the process 600) can be performed in an iterative basis in an inline production process. For example, FIG. 7 is a flowchart of a process 700 that incorporates an improving process for defect prediction in an inline production process of ICs. The process 700 can be implemented as software and/or hardware modules in the system 100 of FIG. 1 and/or the system 300 of FIG. 3. For example, the process 700 can be implemented as modules in the system 300 by one or more apparatuses or systems included in the system 100. The process 700 includes operations 702-708, which are set forth as follows.

At operation 702, feature data of an IC and process condition data of a production process associated with the IC is received. The operation 702 is similar to the operation 402 of FIG. 4. At operation 704, a care area associated with the IC is generated using the feature data, the process condition data, and a defect prediction technique. The operation 704 is similar to the operation 404.

At operation 706, an inspection result is determined by inspecting a care area using a high-resolution inspection system. The operation 706 is similar to the operation 602 of FIG. 6. At operation 708, a parameter of the defect prediction technique is updated based on the inspection result. The operation 708 is similar to the operation 604 of FIG. 6. After the operation 708, the process 700 goes back to the operation 702 to receive new or additional feature data and new or additional process condition data associated with a new IC to be inspected. By updating the parameters, the defect prediction model can improve its prediction accuracy and/or efficiency in generating a new care area for the new IC to be expected.

As shown on the processes 600 and 700, time and resources for preparing (e.g., initializing) the defect prediction model can also be reduced or minimized as long as the performance of the defect prediction technique can be improved by implementing the improving process (e.g., the process 600). The initialization of the defect prediction model can use test data obtained from inspection of ICs. The inspected ICs for generating the test data can be the ICs that were manufactured and inspected in the same production process, or ICs that were manufactured in a different production process (e.g., a different production line or the same production line under different production process conditions).

Figure 8:
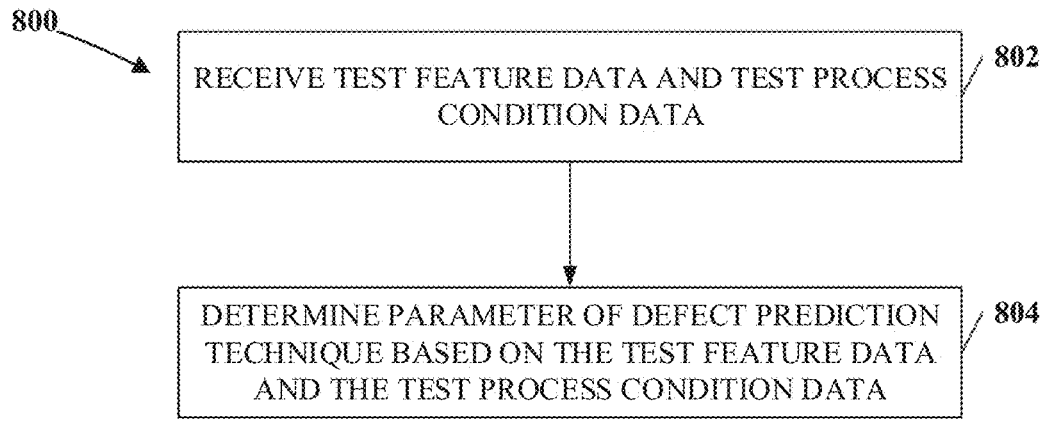
FIG. 8 is a flowchart of an example process of a method for initializing defect prediction according to implementations of this disclosure.

FIG. 8 is a flowchart of an example process 800 of a method for initializing defect prediction according to implementations of this disclosure. The process 800 can be performed online or offline. The process 800 can be implemented as software and/or hardware modules in system 100 of FIG. 1 and/or the system 300 of FIG. 3. For example, the process 800 can be implemented as modules in the system 300 by one or more apparatuses or systems included in system 100. The process 800 includes operations 802-804, which are set forth as follows.

At operation 802, test feature data and test process condition data is received. Both the test feature data and the test process condition data is associated with a defective IC area (e.g., an IC area including a defect detected by a high-resolution inspection system) and a non-defective IC area (e.g., an IC area not including a defect). The defective IC area and the non-defective IC area can be on the same or different ICs. The ICs that include the defective IC area and the non-defective IC area can be ICs manufactured and inspected in the same or different production processes. In some implementations, locations and/or defect type of the defect included in the defective IC area is known (e.g., as "truth"). The test feature data is known feature data of the defective and non-defective IC areas, and the test process condition data is known process condition data of the defective and non-defective IC areas.

At operation 804, a parameter of the defect prediction technique is determined based on the test feature data and the test process condition data. The determination of the parameter can be an iterative process. For example, the defect prediction technique can use predetermined parameter values as a starting point to predict the location and the defect type of the defect in the defective IC area, then update the parameter values until the prediction is correct. In some implementations, during the process 800, the determined parameter of the defect prediction technique can be validated by applying the defect prediction model with the determined parameter on validation data (including new test feature data and new process condition data both associated with a new defective IC area and a new non-defective IC area) to predict a location and/or a defect type of a new defect known and included in the new defective IC. A different parameter value can be used to perform the operation 804 again after the validation process. In some implementations, when there are multiple candidate values for a parameter, a best value of the parameter can be determined during the validation process.

Figure 9:
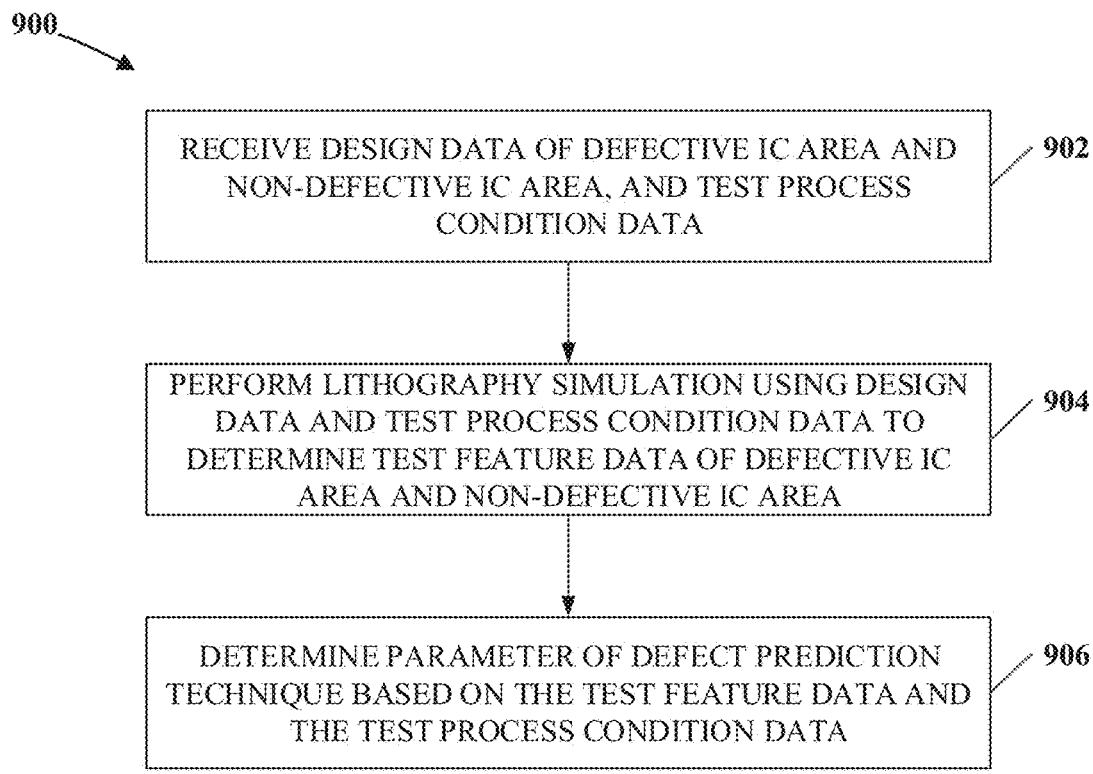
FIG. 9 is a flowchart of another example process of a method for initializing defect prediction according to implementations of this disclosure.

In some implementations, the test feature data in the process 800 of FIG. 8 can be generated using the design data. The test feature data can also be generated in an offline process. FIG. 9 is a flowchart of an example process 900 of a method for initializing defect prediction according to implementations of this disclosure. The process 900 can be performed offline. The process 900 can be implemented as software and/or hardware modules in the system 100 of FIG. 1 and/or the system 300 of FIG. 3. For example, the process 900 can be implemented as modules in the system 300 by one or more apparatuses or systems included in the system 100. The process 900 includes operations 902-906, which are set forth as follows At operation 902, design data of a defective IC area and a non-defective IC area and test process condition data of a production process are received. The design data can include a layout of the IC. In some implementations, the design data can be in a form of GDS files.

At operation 904, lithography simulation is performed using the design data and the test process condition data to determine the test feature data. The lithography simulation is performed for both the defective IC area and the non-defective IC area. For example, the lithography simulation can be performed for an IC (e.g., a die manufactured on a wafer) that includes the defective IC area and/or the non-defective IC area. The lithography simulation of operation 904 is similar to that in the operation 504 of FIG. 5.

At operation 906, a parameter of the defect prediction technique is determined based on the test feature data and the test process condition data. The operation 906 is similar to the operation 804 of FIG. 8.

Figure 10:
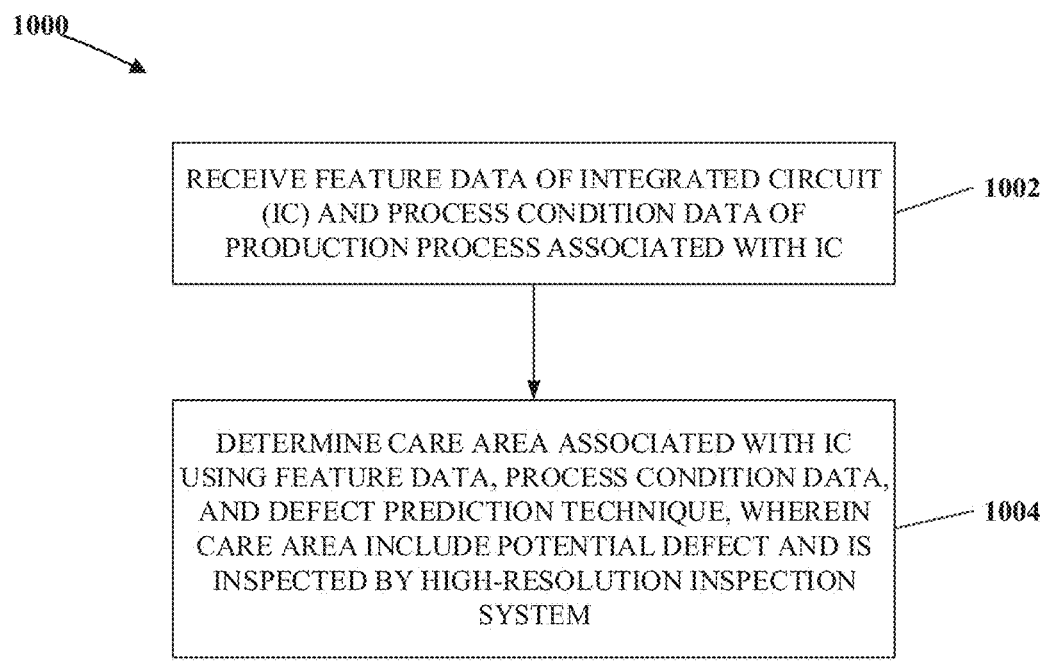
FIG. 10 is a method for defect prediction in accordance with an implementation of this disclosure.

FIG. 10 is a method 1000 for defect prediction in accordance with an implementation of this disclosure. The method 1000 includes receiving feature data of an integrated circuit (IC) and process condition data of a production process associated with the IC, via step 1002, and determining a care area associated with the IC using the feature data, the process condition data, and a defect prediction technique, wherein the care area includes a potential defect and is inspected by a high-resolution inspection system, via step 1004.

In an implementation, the method includes receiving design data comprising a layout of the IC and performing lithography simulation using the design data to determine the feature data. The feature data includes any of a polygon determined from the design data, a rendered image determined from the polygon, a processed image determined from the rendered image.

In an implementation, the process condition data includes any of a focus condition of the production process and a dose condition of the production process, and the defect prediction technique includes any of a parameter associated with focus conditions, a parameter associated with dose conditions, a parameter associated with etching, a parameter associated with chemical-mechanical planarization (CMP). The high-resolution inspection system comprises an electron beam inspection system.

In an implementation, the method includes determining, by the high-resolution inspection system, an inspection result by inspecting the care area and updating a parameter of the defect prediction technique based on the inspection result. The method also includes receiving test feature data and test process condition data both associated with a defective IC area and a non-defective IC area, wherein the defective IC area includes a defect determined by the high-resolution inspection system and the non-defective IC area does not include a defect and determining a parameter of the defect prediction technique based on the test feature data and the test process condition data.

As shown in the above description, the methods and systems set forth in this disclosure for defect prediction include but are not limited to the following advantages.

An advantage of the disclosed methods and systems is that, conditions of focus and dose can be automatically included in defect prediction. The full simulation results can be used under any given focus-dose condition, and inputted to a defect prediction technique (e.g., a defect prediction model) for predicting hot spots and generating care areas based on the predicted hot spots. In this way, the same defect model can be used even the process conditions are changed (e.g., tuned by a process engineer), as long as such changed process conditions can still be mapped to condition variations of focus and/or dose. Besides process condition variations of optical lithography processes (e.g., condition variations of focuses and doses), the defect prediction model can also properly include process condition variations of etch processes, CMP processes, and/or other processes in IC manufacturing. In this way, the lifecycle of the defect prediction model can be increased, and a relation between a particular hot spot and a particular process condition variation can be better understood.

Another advantage of the disclosed methods and systems is that the defect prediction model can be directly built only using inline (or "real-time") or offline inspection data or any combination thereof. Without using CD metrology data, building the defect prediction model can be fast and efficient. As long as reliable inspections of ICs can be performed and a sufficient amount of inspection data can be collected, the defect prediction model can be built and continuously updated. If inline process conditions (e.g., actual conditions of focus and dose) are obtained at the position under inspection, they can be directly inputted to the defect prediction model for care area generation and performance improvement thereof. In this way, full simulations under various combinations or a grid of focuses and doses is not needed.

For the above described advantages, the disclosed methods and systems for defect prediction can be used in production lines or inline production processes. Used in inline production processes, the defect prediction model also has the ability of continuous evolution (i.e., improving prediction accuracy) as inspection goes on. Thus, time, resources, and costs for initial model preparation and data collection can be reduced or minimized.

The implementations herein may be described in terms of functional block components and various processing steps. The disclosed processes and sequences may be performed alone or in any combination. Functional blocks may be realized by any number of hardware and/or software components that perform the specified functions. For example, the described implementations may employ various integrated circuit components, e.g., memory elements, processing elements, logic elements, look-up tables, and the like, which may carry out a variety of functions under the control of one or more microprocessors or other control devices. Similarly, where the elements of the described implementations are implemented using software programming or software elements the disclosure may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the implementations of the disclosure could employ any number of conventional techniques for electronics configuration, signal processing and/or control, data processing and the like.

Aspects or portions of aspects of the above disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or a semiconductor device. Other suitable mediums are also available. Such computer-usable or computer-readable media can be referred to as non-transitory memory or media, and may include RAM or other volatile memory or storage devices that may change over time. A memory of a system described herein, unless otherwise specified, does not have to be physically contained by the system, but is one that can be accessed remotely by the system, and does not have to be contiguous with other memory that might be physically contained by the system.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an aspect" or "one aspect" throughout is not intended to mean the same implementation or aspect unless described as such.

The particular aspects shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. Many alternative or additional functional relationships, physical connections or logical connections may be present in a practical device.

The use of "including" or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for defect prediction, comprising:
   receiving feature data of an integrated circuit (IC) and process condition data of a production process associated with the IC; and
   determining a care area associated with the IC using the feature data, the process condition data, and a defect prediction technique, wherein the care area includes a potential defect and is inspected by a high-resolution inspection system.

2. The method of claim 1, further comprising:
   receiving design data comprising a layout of the IC; and
   performing a lithography simulation using the design data to determine the feature data.

3. The method of claim 2, wherein the feature data includes any of a polygon determined from the design data, a rendered image determined from the polygon, and a processed image determined from the rendered image.

4. The method of claim 1, wherein
the process condition data includes any of a focus condition of the production process and a dose condition of the production process, and
the defect prediction technique includes any of a parameter associated with focus conditions, a parameter associated with dose conditions, a parameter associated with etching, and a parameter associated with chemical-mechanical planarization (CMP).

5. The method of claim 1, wherein the high-resolution inspection system comprises an electron beam inspection system.

6. The method of claim 1, further comprising:
determining, by the high-resolution inspection system, an inspection result by inspecting the care area; and
updating a parameter of the defect prediction technique based on the inspection result.

7. The method of claim 1, further comprising:
receiving test feature data and test process condition data both associated with a defective IC area and a non-defective IC area, wherein the defective IC area includes a defect determined by the high-resolution inspection system and the non-defective IC area does not include a defect; and
determining a parameter of the defect prediction technique based on the test feature data and the test process condition data.

8. A system for defect prediction, comprising:
a processor; and
a memory coupled to the processor, the memory configured to store a set of instructions which when executed by the processor become operational with the processor to:
receive feature data of an integrated circuit (IC) and process condition data of a production process associated with the IC; and
determine a care area associated with the IC using the feature data, the process condition data, and a defect prediction technique, wherein the care area includes a potential defect and is inspected by a high-resolution inspection system.

9. The system of claim 8, wherein the memory is configured to store further instructions when executed by the processor become operational with the processor to:
receive design data comprising a layout of the IC; and
perform a lithography simulation using the design data to determine the feature data.

10. The system of claim 9, wherein the feature data includes any of a polygon determined from the design data, a rendered image determined from the polygon, and a processed image determined from the rendered image.

11. The system of claim 8, wherein
the process condition data includes any of a focus condition of the production process and a dose condition of the production process, and
the defect prediction technique includes any of a parameter associated with focus conditions, a parameter associated with dose conditions, a parameter associated with etching, and a parameter associated with chemical-mechanical planarization (CMP).

12. The system of claim 8, wherein the memory is configured to store further instructions when executed by the processor become operational with the processor to:
determine, by the high-resolution inspection system, an inspection result by inspecting the care area; and
update a parameter of the defect prediction technique based on the inspection result.

13. The system of claim 8, wherein the memory is configured to store further instructions when executed by the processor become operational with the processor to:
receive test feature data and test process condition data both associated with a defective IC area and a non-defective IC area, wherein the defective IC area includes a defect determined by the high-resolution inspection system and the non-defective IC area does not include a defect; and
determine a parameter of the defect prediction technique based on the test feature data and the test process condition data.

14. A non-transitory computer-readable medium storing a set of instructions which when executed by a computer system using a processor become operational with the processor for defect prediction, the non-transitory computer-readable medium comprising instructions to:
receive, during a production process associated with an integrated circuit (IC), feature data of the IC and process condition data of the production process; and
determine, during the production process, a care area associated with the IC using the feature data, the process condition data, and a defect prediction technique, wherein the care area includes a potential defect and is inspected by a high-resolution inspection system.

15. The non-transitory computer-readable medium of claim 14, comprising further instructions to:
receive design data comprising a layout of the IC; and
perform a lithography simulation using the design data to determine the feature data.

16. The non-transitory computer-readable medium of claim 15, wherein the feature data includes any of a polygon determined from the design data, a rendered image determined from the polygon, and a processed image determined from the rendered image.

17. The non-transitory computer-readable medium of claim 14, wherein
the process condition data includes any of a focus condition of the production process and a dose condition of the production process, and
the defect prediction technique includes any of a parameter associated with focus conditions, a parameter associated with dose conditions, a parameter associated with etching, and a parameter associated with chemical-mechanical planarization (CMP).

18. The non-transitory computer-readable medium of claim 14, wherein the high-resolution inspection system comprises an electron beam inspection system.

19. The non-transitory computer-readable medium of claim 14, comprising further instructions to:
determine, by the high-resolution inspection system, an inspection result by inspecting the care area; and
update a parameter of the defect prediction technique based on the inspection result.

20. The non-transitory computer-readable medium of claim 14, comprising further instructions to:
receive test feature data and test process condition data both associated with a defective IC area and a non-defective IC area, wherein the defective IC area includes a defect determined by the high-resolution inspection system and the non-defective IC area does not include a defect; and determine a parameter of the defect prediction technique based on the test feature data and the test process condition data.

* * * * *